(12) United States Patent
Oliver et al.

(10) Patent No.: US 10,687,442 B2
(45) Date of Patent: Jun. 16, 2020

(54) FAN MODULE ASSEMBLY

(71) Applicant: HEWLETT PACKARD ENTERPRISE DEVELOPMENT LP, Houston, TX (US)

(72) Inventors: Joseph Anthony Oliver, Houston, TX (US); Kelly K Smith, Spring, TX (US); Keith A Sauer, Spring, TX (US); James Jeffery Schulze, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/329,574

(22) PCT Filed: Aug. 29, 2014

(86) PCT No.: PCT/US2014/053369
§ 371 (c)(1),
(2) Date: Jan. 26, 2017

(87) PCT Pub. No.: WO2016/032510
PCT Pub. Date: Mar. 3, 2016

(65) Prior Publication Data
US 2017/0265334 A1 Sep. 14, 2017

(51) Int. Cl.
*H05K 7/20* (2006.01)
*F04D 25/16* (2006.01)
(Continued)

(52) U.S. Cl.
CPC ....... *H05K 7/20727* (2013.01); *F04D 25/166* (2013.01); *F04D 29/403* (2013.01);
(Continued)

(58) Field of Classification Search
CPC .......... H05K 7/20727; H05K 7/20172; H05K 7/20136; H05K 7/202; H05K 7/20563;
(Continued)

(56) References Cited

U.S. PATENT DOCUMENTS 6,236,564 B1 5/2001 Fan
6,698,079 B1 * 3/2004 Mimlitch, III ....... H05K 7/1425
211/41.17
(Continued)

FOREIGN PATENT DOCUMENTS

CN 101153616 4/2008
CN 203759638 8/2014

OTHER PUBLICATIONS

PCT/ISA/KR, International Search Report dated Apr. 24, 2015, PCT/US2014/053369, 11 pps.

*Primary Examiner* — Jayprakash N Gandhi
*Assistant Examiner* — Stephen S Sul

(57) ABSTRACT

Example implementations relate to a fan module assembly. One example fan module assembly includes a basepan housed in a chassis of a computing device. The basepan includes a distal end. The fan module assembly also includes a plurality of pins extending from the basepan. The plurality of pins includes a first pin and a second pin. The first pin and the second pin are staggered with respect to a plane defined by the distal end. The fan module assembly further includes a fan module attached to the basepan via the first pin and the second pin.

10 Claims, 4 Drawing Sheets

(51) Int. Cl.
*F04D 29/40* (2006.01)
*F04D 29/60* (2006.01)
*G06F 1/20* (2006.01)

(52) U.S. Cl.
CPC .............. *F04D 29/601* (2013.01); *G06F 1/20* (2013.01); *H05K 7/20172* (2013.01)

(58) Field of Classification Search
CPC ........... H05K 7/20572; H05K 7/20581; H05K 7/20736; H05K 7/20863; F04D 29/601; F04D 25/166; F04D 29/403; G06F 1/20; G06F 1/203; G06F 1/206
USPC ....... 361/679.46–679.54, 688–723; 454/184; 312/236
See application file for complete search history.

(56) References Cited

U.S. PATENT DOCUMENTS

| | | |
|---|---|---|
| 7,758,308 B2 | 7/2010 | Wu |
| 7,940,525 B2 | 5/2011 | Letourneau |
| 8,944,402 B2* | 2/2015 | Sun ........................ G06F 1/183 |
| | | 248/300 |
| 2003/0161103 A1 | 8/2003 | Wrycraft et al. |
| 2004/0005855 A1 | 1/2004 | Giraldo |
| 2005/0259391 A1 | 11/2005 | Garnett |
| 2007/0231157 A1 | 10/2007 | Chuang |
| 2009/0021911 A1 | 1/2009 | Lee |
| 2009/0231804 A1 | 9/2009 | Franz |
| 2012/0113591 A1 | 5/2012 | Chuang |
| 2012/0228465 A1* | 9/2012 | Liu ........................... G06F 1/20 |
| | | 248/674 |
| 2013/0064650 A1 | 3/2013 | Wang |
| 2013/0216411 A1* | 8/2013 | Sun ........................... G06F 1/20 |
| | | 417/423.15 |
| 2013/0256500 A1* | 10/2013 | Sun .................... H05K 7/20172 |
| | | 248/674 |
| 2013/0259675 A1* | 10/2013 | Sun .................... H05K 7/20172 |
| | | 415/213.1 |
| 2014/0029191 A1 | 1/2014 | Terwilliger |
| 2014/0167578 A1* | 6/2014 | Lesser ................. H05K 7/1489 |
| | | 312/223.2 |

\* cited by examiner

FAN MODULE ASSEMBLY

BACKGROUND

Fans may be used to provide active cooling of components, such as memory modules and processors, inside a chassis of a computing device. Fans may be used to draw in air outside of a chassis to lower the air temperature inside the chassis. Fans may also be used to expel hot air inside the chassis to lower the air temperature inside the chassis.

BRIEF DESCRIPTION OF THE DRAWINGS

Some examples of the present application are described with respect to the following figures.

DETAILED DESCRIPTION

As described above, fans may be used to provide active cooling of components inside a chassis of a computing device. A fan may be mounted to a chassis using a fan cage. A fan cage may be a metal enclosure that houses one or more fans and includes an electrical connector to power the one or more fans. However, the use of a fan cage increases a manufacturing cost and/or manufacturing complexity of a chassis due to the electrical connector.

Examples described herein provide a fan module assembly that utilizes at least one pin extending from a basepan to retain and to position a fan module in a chassis. For example, a fan module assembly may include a basepan housed in a chassis of a computing device, such as a rackmount chassis of a server computer. A first pin and a second pin may extend from the basepan. The first pin and the second pin may be staggered with respect to a plane defined by a distal end of the basepan. A fan module may be coupled to the basepan via the first pin and the second pin. In this manner, examples described herein may reduce a manufacturing cost and/or manufacturing complexity of a chassis.

Figure 1:
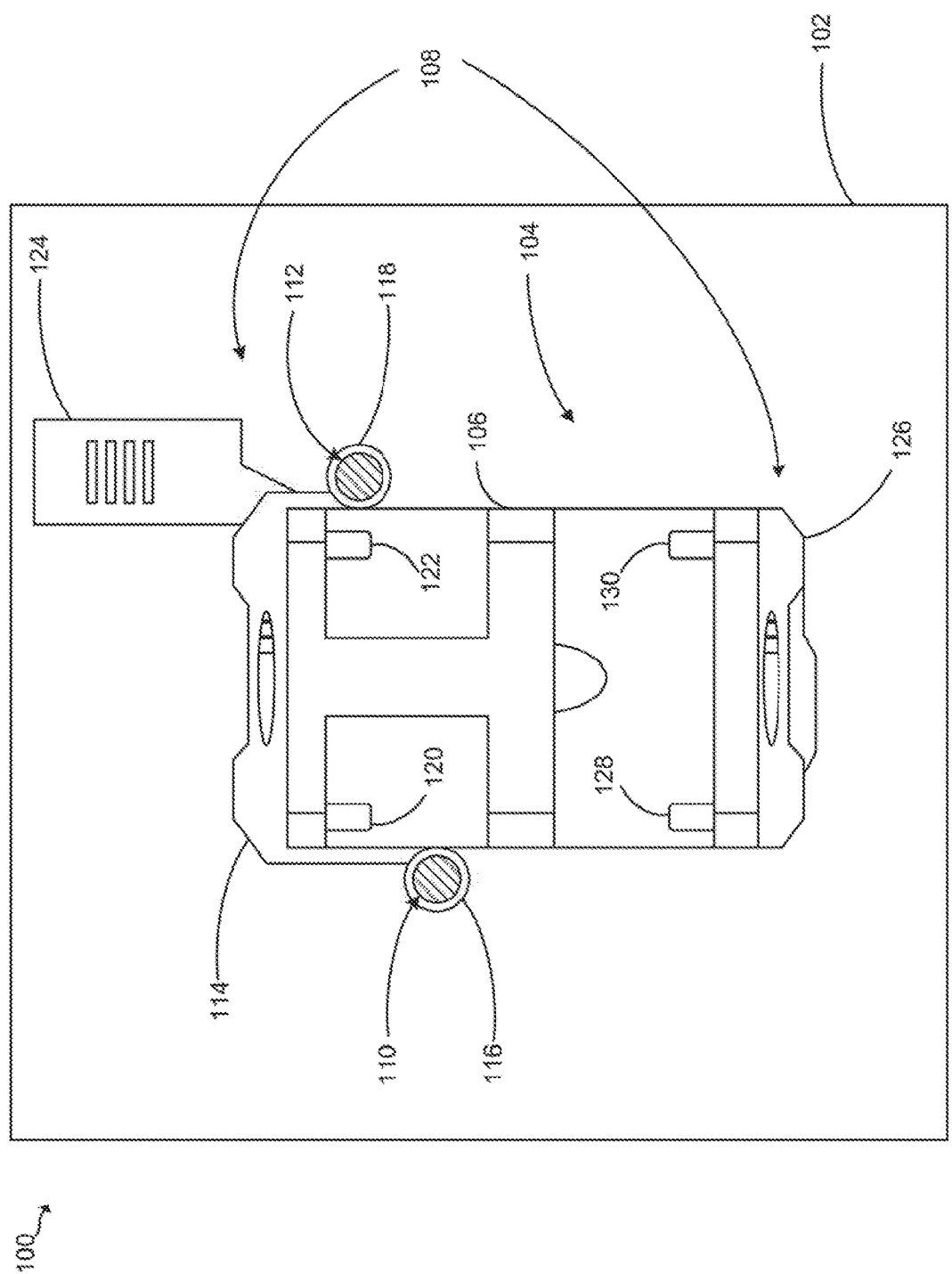
FIG. 1 is a top view of a fan module assembly, according to an example.

Referring now to the figures, FIG. 1 is a top view of a fan module assembly 100, according to an example. Fan module assembly 100 may include a basepan 102 and a fan module 104. Fan module 104 may include a fan 106 and a fan housing 108. Basepan 102 may be a supporting structure to receive fan module 104. In some examples, basepan 102 may be formed using sheet metal and may be housed in a chassis of a computing device via fasteners. In some examples, basepan 102 may be built as part of a chassis of a computing device. Basepan 102 may include a first pin 110 and a second pin 112. As used herein, a pin may be a rod or a structure that protrudes from a substantially flat surface. Pins 110-112 may extend from basepan 102 perpendicularly. Pins 110-112 may be used to retain fan module 104 to basepan 102. First pin 110 and second pin 112 may be located on basepan 102 in a staggered configuration. The staggered configuration of pins of a basepan is described in more detail with reference to FIG. 2.

Fan housing 108 may include a frame 114, a first pin receptacle 116, and a second pin receptacle 118. Pin receptacles 116-118 may extend from frame 114. Pin receptacles 116-118 may be in a staggered configuration to receive pins 110-112, respectively, to enable fan module 104 to be coupled/retained to basepan 102. A first end of fan 106, such as a front end of fan 106, may be coupled to fan housing 108 via a plurality of tabs, such as tabs 120 and 122. In some examples, fan housing 108 may also include an electrical receptacle housing 124 extending from frame 114. Electrical receptacle housing 124 may guide a power cable of fan 106 to be mated to a power connector on a computing device. Thus, the use of a power connector on fan housing 108 may be avoided. In some examples, fan housing 108 may also include a rear frame 126 attached to a second end of fan 106, such as a back end of fan 106, via tabs 128-130.

Figure 2:
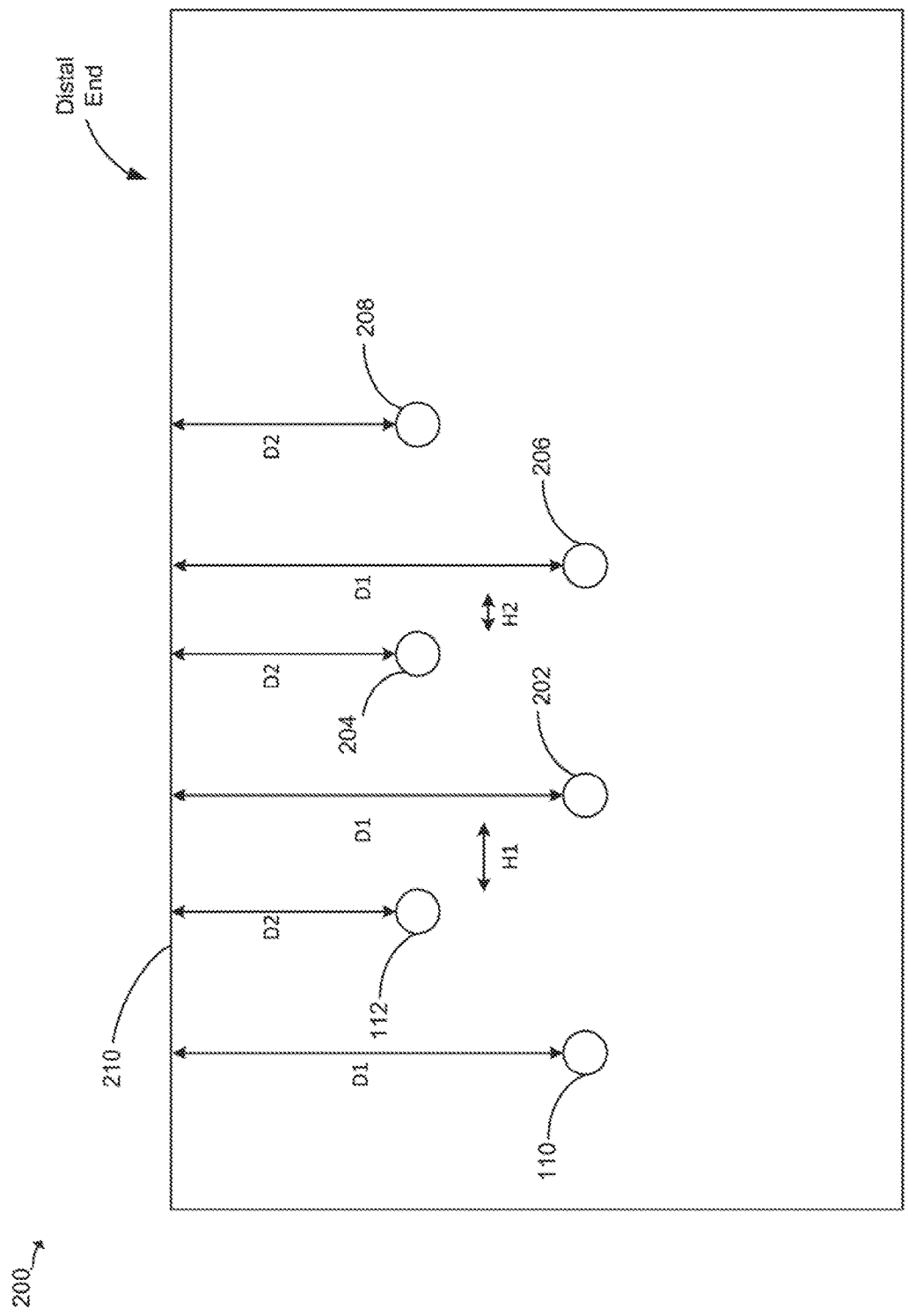
FIG. 2 is a top view of a basepan of a fan module assembly, according to an example.

FIG. 2 is a top view of a basepan 200 of a fan module assembly, according to an example. Basepan 200 may be similar to basepan 102 of FIG. 1. Basepan 200 may include a plurality of pins extending therefrom, such as first pin 110, second pin 112, a third pin 202, a fourth pin 204, a fifth pin 206, and a sixth pin 208.

First pin 110 and second pin 112 may be in a staggered configuration with respect to a plane 210 as defined by a distal end of basepan 200. Plane 210 may be any plane used as a point of reference. Third pin 202 and fourth pin 204 may also be in a staggered configuration with respect to plane 210. As used herein, a staggered configuration of pins means that two pins are not aligned horizontally. For example, first pin 110, third pin 202, and fifth pin 206 may be a first distance D1 from plane 210. Second pin 112, fourth pin 204, and sixth pin 208 may be a second distance D2 from plane 210. Thus, first pin 110 may be aligned with third pin 202 and fifth pin 206. Second pin 112 may be aligned with fourth pin 204 and sixth pin 208. As described in more detail with reference to FIG. 3, when fan modules (not shown in FIG. 2) are retained to basepan 200 via pins 110-112, 202-204, and 206-208, respectively, the fan modules may be aligned by the staggered configuration of pins 110-112, 202-204, and 206-208.

In addition to being positioned in a staggered configuration, pins 110-112, 202-204, and 206-208 may be positioned on basepan 200 to provide variable spacing among fan modules. For example, second pin 112 and third pin 202 may be positioned on basepan 200, for example, during manufacturing, to be spaced apart horizontally by a distance H1. Fourth pin 204 and fifth pin 206 may be positioned on basepan 200 be spaced apart horizontally by a distance H2. Thus, a horizontal spacing between a first fan module (not shown in FIG. 2) retained via pins 110-112 and a second fan module (not shown in FIG. 2) retained via pins 202-204 may be defined by the distance H1. A horizontal spacing between the second fan module and a third fan module (not shown in FIG. 2) retained via pins 206-208 may be defined by the distance H2. Varying horizontal spacing among fan modules is described in more detail with reference to FIG. 3.

Figure 3:
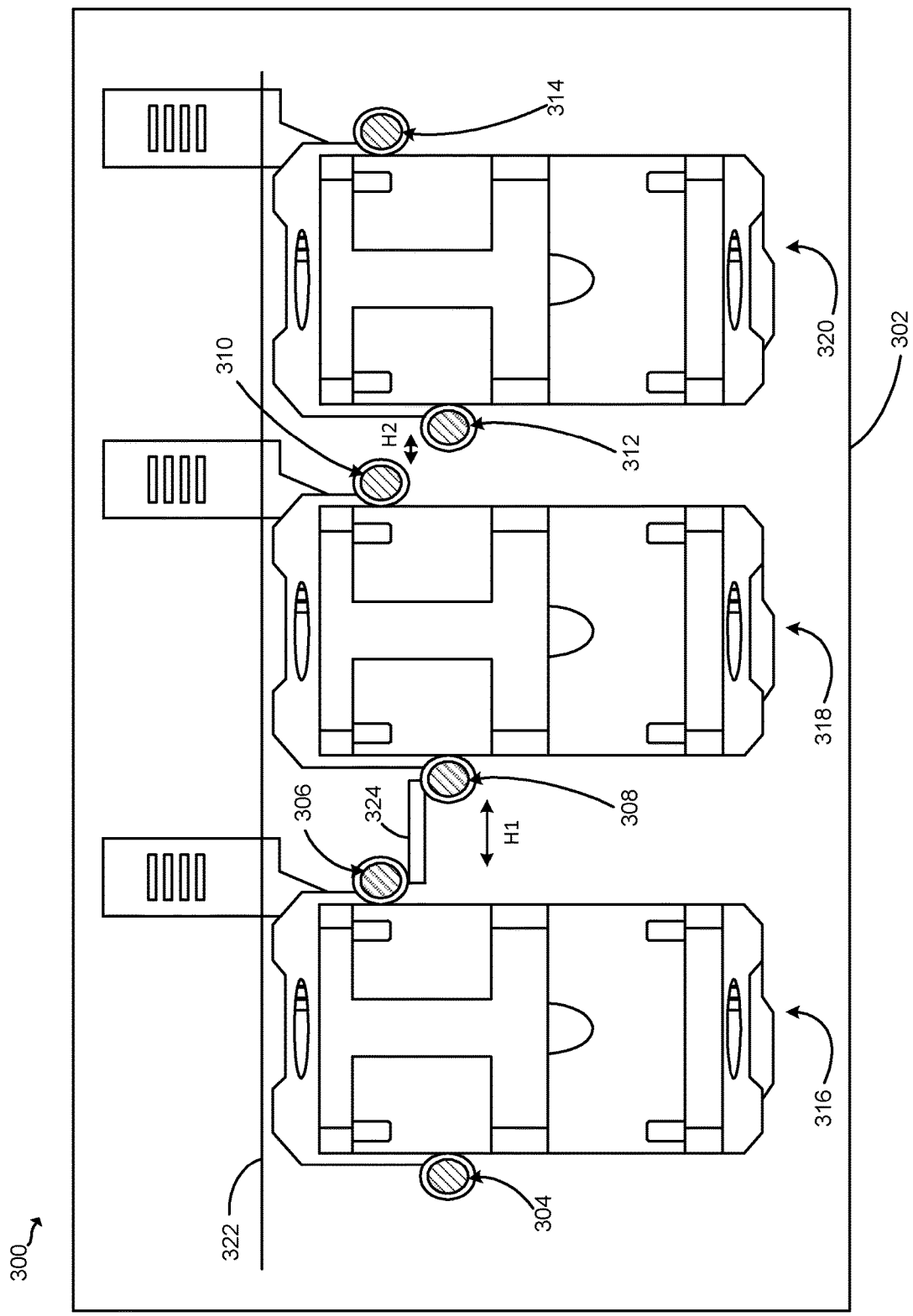
FIG. 3 is a top view of a fan module assembly, according to another example.

FIG. 3 is a top view of a fan module assembly 300, according to another example. Fan module assembly 300 may include a basepan 302 similar to basepan 102 of FIG. 1 and/or basepan 200 of FIG. 2. Basepan 302 may be housed in a chassis 350. In some examples, basepan 102 may be formed using sheet metal and may be housed in chassis 350 of a computing device via fasteners. In some examples, basepan 302 may be built as part of chassis 350 of a computing device. Basepan 302 may include a plurality of pins, such as pins 304-312. Fan module assembly may also include a plurality of fan modules 316-320 retained to basepan 302 via pins 304-312. Fan modules 316-320 may be similar to fan module 104 of FIG. 1.

For example, pins 304-306 may be in a staggered configuration to retain fan module 316. Pins 308-310 may be in a staggered configuration to retain fan module 318. Pins 312-314 may be in a staggered configuration to retain fan module 320. Pins 304, 308, and 312 may be aligned. Pins 306, 310, and 314 may be aligned. Thus, fan modules 316-320 may be aligned with respect to a plane 322.

Pin 306 and pin 308 may have a horizontal spacing equal to the distance H1. Pin 310 and pin 312 may have a horizontal spacing equal to the distance H2 such that pin 310 and pin 312 may partially overlap. Thus, a horizontal spacing between fan module 316 and fan module 318 may be defined by the distance H1. A horizontal spacing between fan module 318 and fan module 320 may be defined by the distance H2.

By varying the horizontal spacing between fan modules, the number of fan modules retained to basepan 302 may be controlled. For example, when a greater fan module density is desired, the horizontal spacing between two fan modules on basepan 302 may be defined by the distance H2. When a lower fan module density is desired, for example, to reduce manufacturing cost, the horizontal spacing between two fan modules on basepan 302 may be defined by the distance H1. In some examples, a divider 324 may be inserted between pin 306 and pin 308 to reduce air recirculation through the horizontal spacing between fan module 316 and fan module 318.

Figure 4:
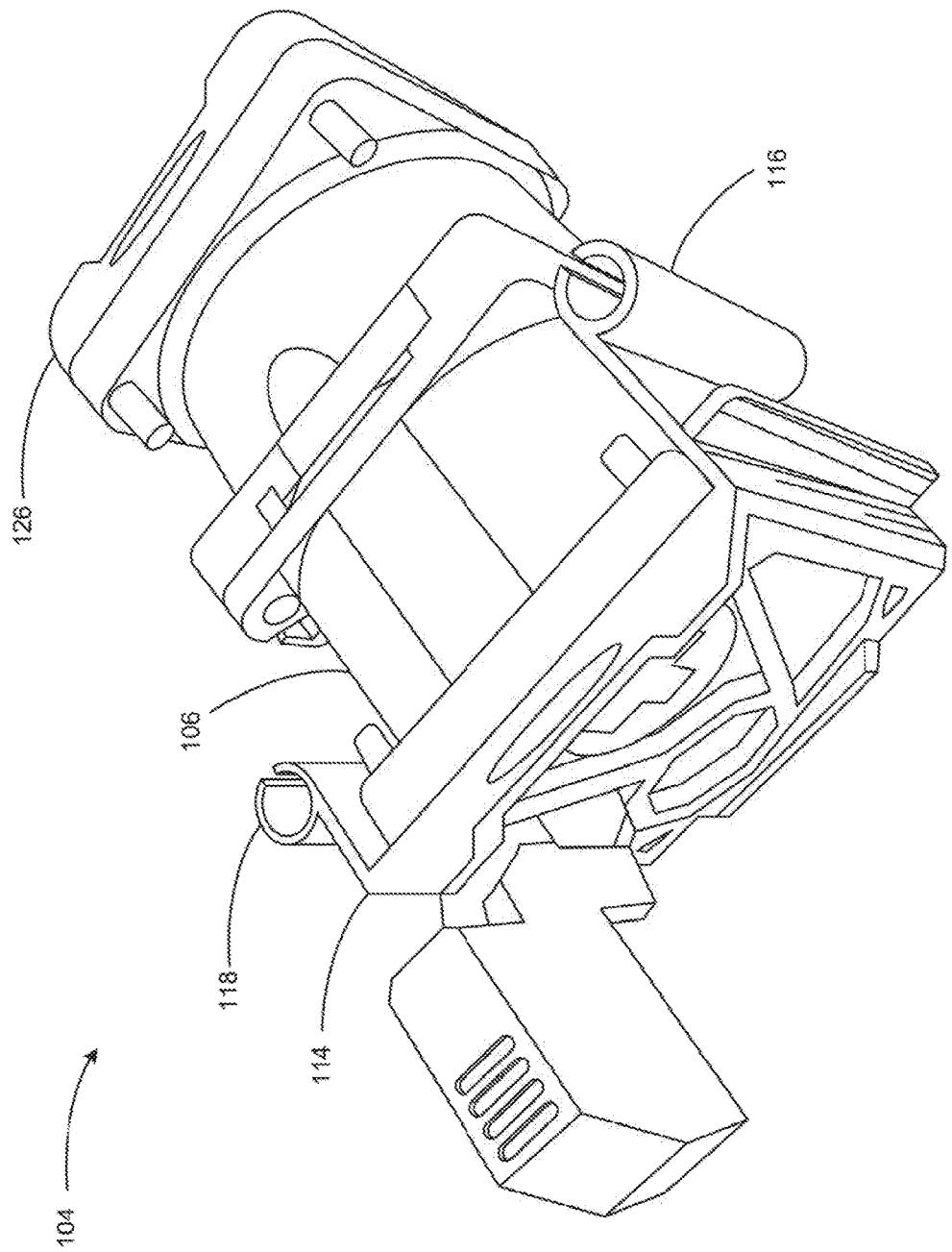
FIG. 4 is a front view of a fan module of FIG. 1, according to an example.

FIG. 4 is a front view of fan module 104 of FIG. 1, according to an example. As illustrated in FIG. 4, frame 114 may serve as a blade guard for the front end of fan 106. Rear frame 126 may serve as a blade guard for the back end of fan 106. In some examples, pin receptacles 116-118 may have a cylindrical shape to receive pins 110-112, respectively. However, it should be understood that pin receptacles 116-118 may have any shape desired to receive pins 110-112.

The use of "comprising", "including" or "having" are synonymous and variations thereof herein are meant to be inclusive or open-ended and do not exclude additional unrecited elements or method steps.

What is claimed is:

1. A fan module assembly comprising:
   a basepan to support fan modules of a computing device; and
   a plurality of pin groups, wherein each of the pin groups includes a first pin and a second pin extending from the basepan that are to attach one of the fan modules to the basepan, wherein each of the first pins is a first distance from a distal end of the basepan and each of the second pins is a second distance from the distal end, and
   the pin groups are arranged such that respective distances between immediately adjacent first pins have at least two different magnitudes.

2. The fan module assembly of claim 1,
   wherein the pin groups include a first pin group, a second pin group immediately adjacent to the first pin group, and a third pin group immediately adjacent to the second pin group, and
   the distance between the respective first pins of the first pin group and the second pin group is different from the distance between the respective first pins of the second pin group and the third pin group.

3. The fan module assembly of claim 1, wherein each of the fan modules include a fan housing and a fan coupled to the fan housing, wherein the fan housing includes a frame, a first pin receptacle extending from the frame to receive the first pin of one of the pin groups, and a second pin receptacle extending from the frame to receive the second pin of the one of the pin groups.

4. The fan module assembly of claim 3, wherein the fan housing further includes an electrical receptacle housing extending from the frame.

5. The fan module assembly of claim 1, further comprising a divider between two of the immediately adjacent pin groups to reduce air circulation between the fan modules attached to the two of the immediately adjacent pin groups.

6. A fan module assembly comprising:
   a basepan that is to be housed in a chassis of a computing device, wherein the basepan includes a distal end; and
   a plurality of pin groups, each including a first pin and a second pin extending from the basepan that are to attach a respective fan module of a plurality of fan modules to the basepan, wherein each of the first pins is a first distance from a distal end of the basepan and each of the second pins is a second distance from the distal end;
   wherein the pin groups include a first pin group, a second pin group immediately adjacent to the first pin group, and a third pin group immediately adjacent to the second pin group, and
   the respective first pins of the first pin group and the second pin group are closer together than are the respective first pins of the second pin group and the third pin group.

7. The fan module assembly of claim 6, wherein each fan module of the plurality of fan modules includes a fan housing and a fan coupled to the fan housing, wherein the fan housing includes a frame, a first pin receptacle extending from the frame to receive the first pin of one of the pin groups, and a second pin receptacle extending from the frame to receive the second pin of one of the pin groups.

8. An apparatus comprising:
   a chassis of a computing device;
   a basepan housed in the chassis, wherein the basepan includes a distal end;
   a plurality of pin groups, each including a first pin and a second pin extending from the basepan, wherein each of the first pins is a first distance from a distal end of the basepan and each of the second pins is a second distance from the distal end;
   a first fan module attached to the basepan via a first pin group of the pin groups;
   a second fan module attached to the basepan via a second pin group of the pin groups immediately adjacent to the first pin group; and
   a third fan module attached to the basepan via a third pin group of the pin groups immediately adjacent to the second pin group,
   wherein the first fan module and the second fan module are closer together than are the second fan module and the third module.

9. The apparatus of claim 8, wherein the first fan module is aligned with the second fan module.

10. The apparatus of claim 8, further comprising a divider between the first fan module and the second fan module to reduce air circulation between the first fan module and the second fan module.

* * * * *